United States Patent
Pagaila et al.

(10) Patent No.: US 9,236,332 B2
(45) Date of Patent: Jan. 12, 2016

(54) SEMICONDUCTOR DEVICE AND METHOD OF FORMING VERTICALLY OFFSET BOND ON TRACE INTERCONNECT STRUCTURE ON LEADFRAME

(71) Applicant: STATS ChipPAC, Ltd., Singapore (SG)

(72) Inventors: Reza A. Pagaila, Tangerang (ID); KiYoun Jang, Kyoungki-do (KR); HunTeak Lee, Kyoungki-do (KR)

(73) Assignee: STATS ChipPAC, Ltd., Singapore (SG)

( * ) Notice: Subject to any disclaimer, the term of this patent is extended or adjusted under 35 U.S.C. 154(b) by 116 days.

(21) Appl. No.: 13/765,594

(22) Filed: Feb. 12, 2013

(65) Prior Publication Data

US 2013/0154067 A1  Jun. 20, 2013

Related U.S. Application Data

(62) Division of application No. 12/822,504, filed on Jun. 24, 2010, now Pat. No. 8,409,978.

(51) Int. Cl.
*H01L 23/495* (2006.01)
*H01L 23/31* (2006.01)
*H01L 23/00* (2006.01)

(52) U.S. Cl.
CPC ...... *H01L 23/4952* (2013.01); *H01L 23/49513* (2013.01); *H01L 23/49541* (2013.01); *H01L 23/49548* (2013.01); *H01L 23/49582* (2013.01); *H01L 24/48* (2013.01); *H01L 24/49* (2013.01); *H01L 23/3107* (2013.01); *H01L 24/29* (2013.01); *H01L 2224/0401* (2013.01); *H01L 2224/05001* (2013.01); *H01L 2224/05082* (2013.01); *H01L 2224/05111* (2013.01); *H01L 2224/05155* (2013.01); *H01L 2224/05624* (2013.01); *H01L 2224/05639* (2013.01); *H01L 2224/05644* (2013.01); *H01L 2224/05647* (2013.01); *H01L 2224/16225* (2013.01); *H01L 2224/2919* (2013.01); *H01L 2224/32057* (2013.01); *H01L 2224/32245* (2013.01); *H01L 2224/451* (2013.01); *H01L 2224/48091* (2013.01); *H01L 2224/48247* (2013.01); *H01L 2224/48249* (2013.01); *H01L 2224/49109* (2013.01); *H01L 2224/49171* (2013.01); *H01L 2224/73265* (2013.01); *H01L 2224/83385* (2013.01);

(Continued)

(58) Field of Classification Search
None
See application file for complete search history.

(56) References Cited

U.S. PATENT DOCUMENTS 5,378,859 A  1/1995 Shirasaki et al.
5,386,624 A  2/1995 George et al.

(Continued)

*Primary Examiner* — Jarrett Stark
(74) *Attorney, Agent, or Firm* — Robert D. Atkins; Patent Law Group: Atkins and Associates, P.C.

(57) ABSTRACT

A semiconductor device has a vertically offset BOT interconnect structure. The vertical offset is achieved with a leadframe having a plurality of lead fingers around a die paddle. A first conductive layer is formed over the lead fingers. A second conductive layer is formed over the lead fingers. Each second conductive layer is positioned adjacent to the first conductive layer and each first conductive layer is positioned adjacent to the second conductive layer. The second conductive layer has a height greater than a height of the first conductive layer. The first and second conductive layers can have a side-by-side arrangement or staggered arrangement. Bumps are formed over the first and second conductive layers. Bond wires are electrically connected to the bumps. A semiconductor die is mounted over the die paddle of the leadframe and electrically connected to the bond wires and BOT interconnect structure.

23 Claims, 8 Drawing Sheets

(52) U.S. Cl.
CPC ... *H01L2224/92* (2013.01); *H01L 2224/92247* (2013.01); *H01L 2924/00014* (2013.01); *H01L 2924/0103* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01014* (2013.01); *H01L 2924/01024* (2013.01); *H01L 2924/01028* (2013.01); *H01L 2924/01029* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/01322* (2013.01); *H01L 2924/12041* (2013.01); *H01L 2924/1306* (2013.01); *H01L 2924/13091* (2013.01)

(56) References Cited

U.S. PATENT DOCUMENTS

| | | | |
|---|---|---|---|
| 5,434,410 A | 7/1995 | Kulwicki | |
| 5,508,561 A | 4/1996 | Tago et al. | |
| 5,519,580 A | 5/1996 | Natarajan et al. | |
| 5,650,595 A | 7/1997 | Bentlage et al. | |
| 5,661,337 A | 8/1997 | Manteghi | |
| 5,710,071 A | 1/1998 | Beddingfield et al. | |
| 5,844,782 A | 12/1998 | Fukasawa | |
| 5,869,886 A | 2/1999 | Tokuno | |
| 5,872,399 A | 2/1999 | Lee | |
| 5,889,326 A | 3/1999 | Tanaka | |
| 5,915,169 A | 6/1999 | Heo | |
| 5,985,456 A | 11/1999 | Zhou et al. | |
| 6,201,305 B1 | 3/2001 | Darveaux et al. | |
| 6,215,175 B1 | 4/2001 | Kinsman | |
| 6,218,630 B1 | 4/2001 | Takigami | |
| 6,228,466 B1 | 5/2001 | Tsukada et al. | |
| 6,259,163 B1 | 7/2001 | Ohuchi et al. | |
| 6,281,450 B1 | 8/2001 | Urasaki et al. | |
| 6,297,560 B1 | 10/2001 | Capote et al. | |
| 6,324,754 B1 | 12/2001 | DiStephano et al. | |
| 6,329,605 B1 | 12/2001 | Beroz et al. | |
| 6,335,568 B1 | 1/2002 | Yuzawa et al. | |
| 6,335,571 B1 | 1/2002 | Capote et al. | |
| 6,396,707 B1 | 5/2002 | Huang et al. | |
| 6,441,316 B1 | 8/2002 | Kusui | |
| 6,448,665 B1 | 9/2002 | Nakazawa et al. | |
| 6,600,234 B2 | 7/2003 | Kuwabara et al. | |
| 6,608,388 B2 | 8/2003 | Lin et al. | |
| 6,710,458 B2 | 3/2004 | Seko | |
| 6,734,557 B2 | 5/2004 | Taniguchi et al. | |
| 6,774,497 B1 | 8/2004 | Qi et al. | |
| 6,780,673 B2 | 8/2004 | Venkateswaran | |
| 6,787,918 B1 | 9/2004 | Tsai et al. | |
| 6,809,262 B1 | 10/2004 | Hsu | |
| 6,818,545 B2 | 11/2004 | Lee et al. | |
| 6,849,944 B2 | 2/2005 | Murtuza et al. | |
| 6,870,276 B1 | 3/2005 | Moxham et al. | |
| 6,888,255 B2 | 5/2005 | Murtuza et al. | |
| 6,913,948 B2 | 7/2005 | Caletka et al. | |
| 7,005,585 B2 | 2/2006 | Ishizaki | |
| 7,005,750 B2 | 2/2006 | Liu | |
| 7,049,705 B2 | 5/2006 | Huang | |
| 7,057,284 B2 | 6/2006 | Chauhan et al. | |
| 7,064,435 B2 | 6/2006 | Chung et al. | |
| 7,098,407 B2 | 8/2006 | Kim et al. | |
| 7,102,239 B2 | 9/2006 | Pu et al. | |
| 7,173,828 B2 | 2/2007 | Lin et al. | |
| 7,224,073 B2 | 5/2007 | Kim | |
| 7,242,099 B2 | 7/2007 | Lin et al. | |
| 7,271,484 B2 | 9/2007 | Reiss et al. | |
| 7,294,929 B2 | 11/2007 | Miyazaki | |
| 7,317,245 B1 | 1/2008 | Lee et al. | |
| 7,405,484 B2 | 7/2008 | Usui et al. | |
| 7,436,063 B2 | 10/2008 | Miyata et al. | |
| 7,453,156 B2 | 11/2008 | Lee et al. | |
| 7,521,284 B2 | 4/2009 | Miranda et al. | |
| 7,598,599 B2 | 10/2009 | Chow et al. | |
| 7,642,660 B2 | 1/2010 | Tay et al. | |
| 7,670,939 B2 | 3/2010 | Topacio et al. | |
| 7,671,454 B2 | 3/2010 | Seko | |
| 7,731,078 B2 * | 6/2010 | Lee et al. | 228/180.5 |
| 7,732,913 B2 | 6/2010 | Hsieh et al. | |
| 7,750,457 B2 | 7/2010 | Seko | |
| 7,790,509 B2 | 9/2010 | Gerber | |
| 7,791,211 B2 | 9/2010 | Chen et al. | |
| 7,847,399 B2 | 12/2010 | Masumoto | |
| 7,847,417 B2 | 12/2010 | Araki et al. | |
| 7,851,928 B2 | 12/2010 | Gallegos et al. | |
| 7,898,083 B2 | 3/2011 | Castro | |
| 7,902,660 B1 | 3/2011 | Lee et al. | |
| 7,902,678 B2 | 3/2011 | Ohuchi et al. | |
| 7,902,679 B2 | 3/2011 | Lin et al. | |
| 7,932,170 B1 | 4/2011 | Huemoeller et al. | |
| 7,947,602 B2 | 5/2011 | Ito et al. | |
| 8,039,384 B2 | 10/2011 | Pagaila et al. | |
| 2004/0056341 A1 | 3/2004 | Endo et al. | |
| 2004/0232562 A1 | 11/2004 | Hortaleza et al. | |
| 2005/0103516 A1 | 5/2005 | Kaneyuki | |
| 2005/0248037 A1 | 11/2005 | Hung et al. | |
| 2005/0287711 A1 | 12/2005 | Huang et al. | |
| 2006/0102694 A1 | 5/2006 | Lee et al. | |
| 2006/0131758 A1 | 6/2006 | Dao | |
| 2007/0200234 A1 | 8/2007 | Gerber et al. | |
| 2007/0235869 A1 | 10/2007 | Jang et al. | |
| 2008/0093749 A1 | 4/2008 | Gerber et al. | |
| 2008/0157402 A1 | 7/2008 | Ramakrishna et al. | |
| 2008/0179740 A1 | 7/2008 | Liao | |
| 2008/0277802 A1 | 11/2008 | Tsai et al. | |
| 2009/0108445 A1 | 4/2009 | Liang | |
| 2009/0114436 A1 | 5/2009 | Chen et al. | |
| 2009/0152716 A1 | 6/2009 | Sohara | |
| 2009/0191329 A1 | 7/2009 | Wang | |
| 2009/0288866 A1 | 11/2009 | Tsai et al. | |
| 2009/0308647 A1 | 12/2009 | Liao | |
| 2009/0309237 A1 | 12/2009 | Chow et al. | |
| 2010/0059866 A1 | 3/2010 | Jang et al. | |
| 2010/0139965 A1 | 6/2010 | Wang et al. | |
| 2011/0049703 A1 | 3/2011 | Hsu et al. | |
| 2011/0254146 A1 | 10/2011 | Cho et al. | |

* cited by examiner

SEMICONDUCTOR DEVICE AND METHOD OF FORMING VERTICALLY OFFSET BOND ON TRACE INTERCONNECT STRUCTURE ON LEADFRAME

CLAIM TO DOMESTIC PRIORITY

The present application is a division of U.S. patent application Ser. No. 12/822,504, now U.S. Pat. No. 8,409,978, filed Jun. 24, 2010, which application is incorporated herein by reference.

FIELD OF THE INVENTION

The present invention relates in general to semiconductor devices and, more particularly, to a semiconductor device and method of forming a vertically offset bond on trace (BOT) interconnect structure on a leadframe.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Many semiconductor devices require a fine pitch between the interconnect structures, e.g., between bond wire bumps, for a high interconnect density and input/output (I/O) terminal count. Conventional wire-bonding on a leadframe requires adjacent leads to be separated with a relatively large interconnect pitch to avoid wire or ball shorting. The large interconnect pitch decreases the I/O count. As one solution, the bond wire bumps can be laterally offset, staggered, or zig-zag pattern extending from the signal traces. The lateral offset allows the bond wire bumps to be positioned closer together, i.e., small pitch, without electrically shorting adjacent terminals. However, the lateral offset also requires longer bond fingers in order to form the bond wire bumps, which increase die size. The space requirements limit use of smaller substrates and add materials cost.

SUMMARY OF THE INVENTION

A need exists to decrease bond wire bump pitch on a leadframe. Accordingly, in one embodiment, the present invention is a semiconductor device comprising a substrate including a first lead finger and second lead finger. A first conductive layer is formed over the first lead finger. A second conductive layer is formed over the second lead finger. A height of the second conductive layer is greater than a height of the first conductive layer. A first bump is formed over the first conductive layer. A second bump is formed over the second conductive layer with the second bump overlapping the first bump.

In another embodiment, the present invention is a semiconductor device comprising a substrate including a first lead finger and second lead finger. A height of the second lead finger is greater than a height of the first lead finger. A first interconnect structure is formed over the first lead finger. A second interconnect structure is formed over the second lead finger with the second interconnect structure overlapping the first interconnect structure.

In another embodiment, the present invention is a semiconductor device comprising a substrate including a first lead finger and second lead finger vertically offset from the first lead finger. A first interconnect structure is formed over the first lead finger. A second interconnect structure is formed over the second lead finger with the second interconnect structure overlapping the first interconnect structure.

In another embodiment, the present invention is a semiconductor device comprising a substrate including a first lead finger and second lead finger vertically offset from the first lead finger. A BOT interconnect structure is formed over the first lead finger and second lead finger.

DETAILED DESCRIPTION OF THE DRAWINGS

Figure 1:
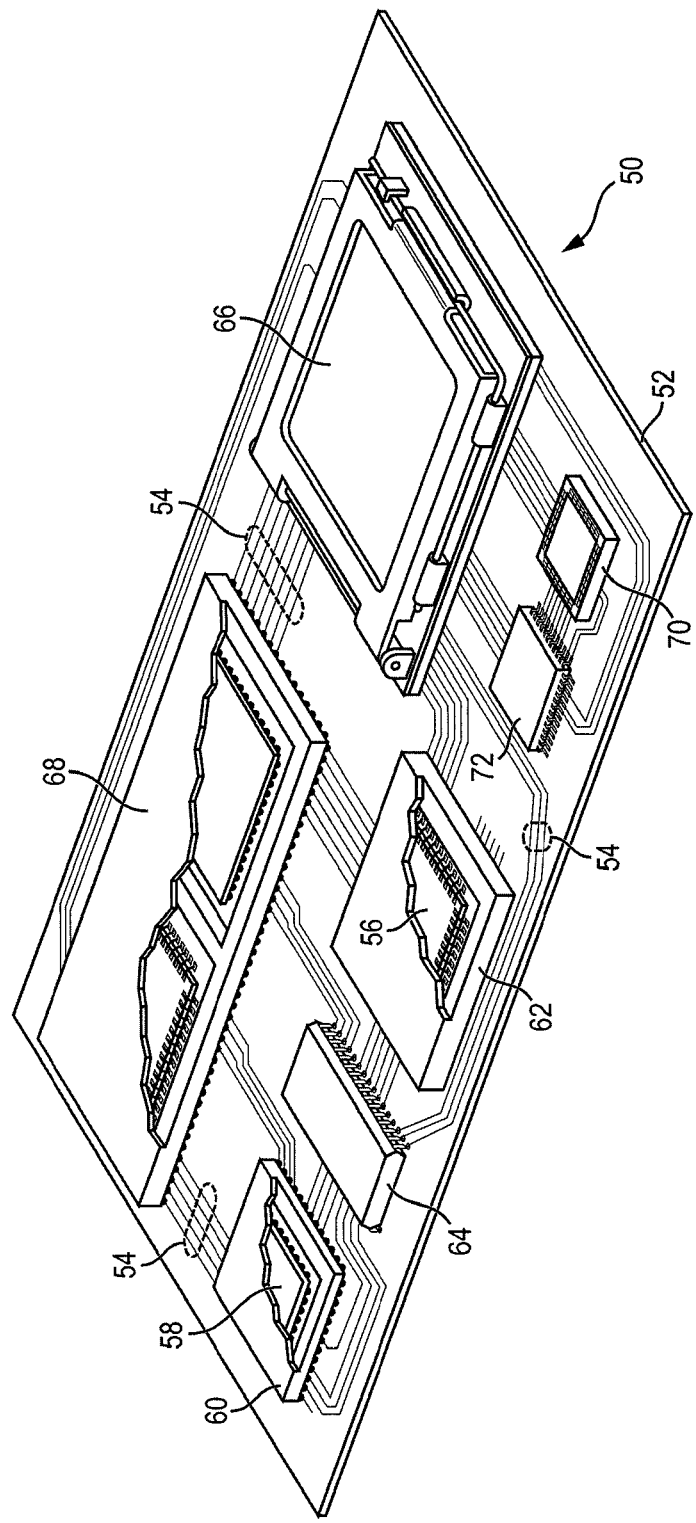
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
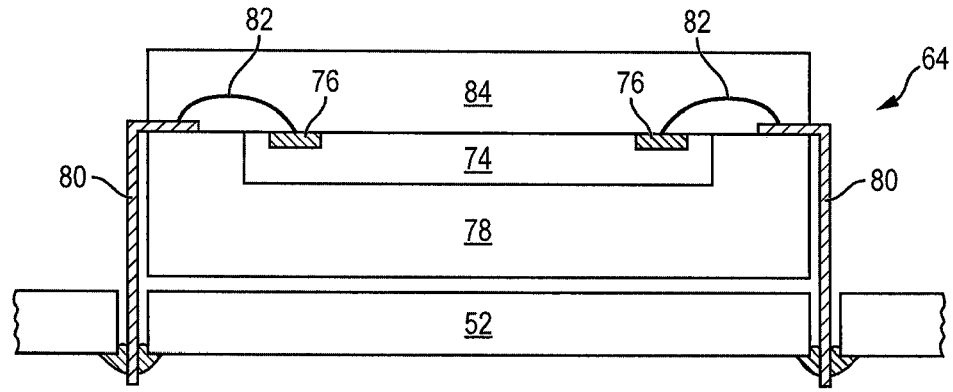
FIGS. 2a-2c illustrate further detail of the representative semiconductor packages mounted to the PCB.
Figure 2B:
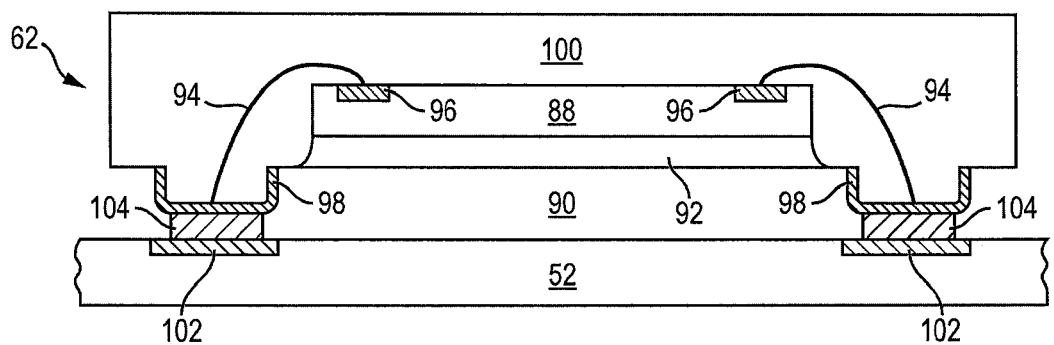
Figure 2C:
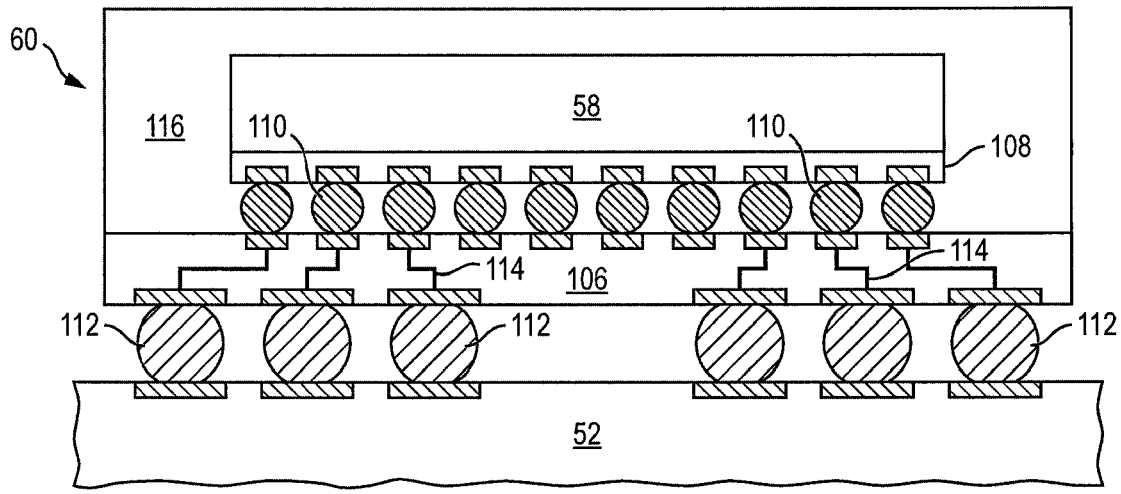

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3:
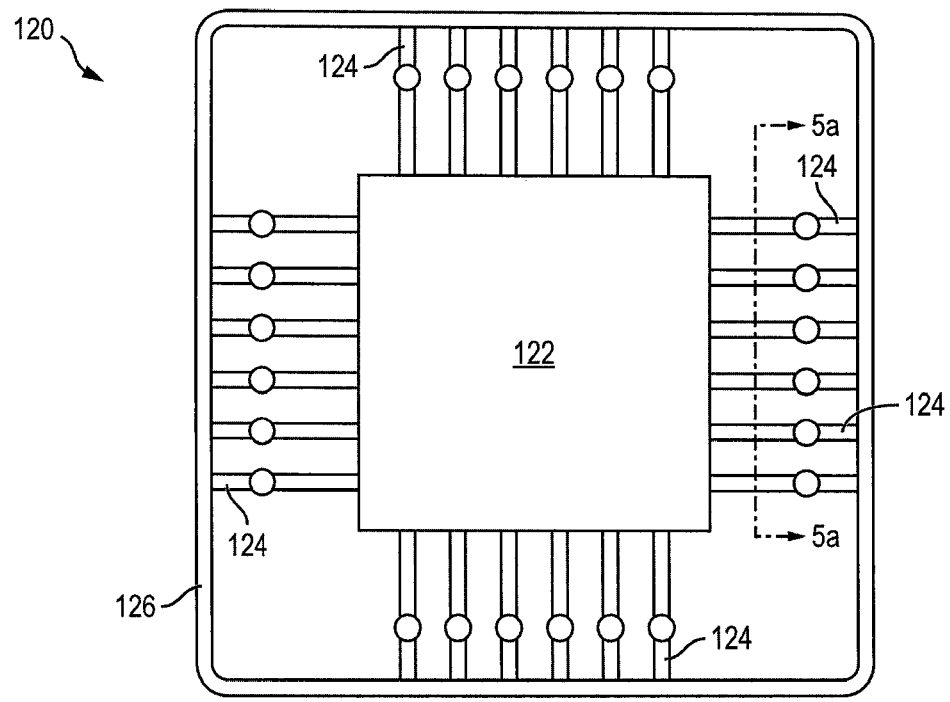
FIG. 3 illustrates a leadframe with lead fingers disposed around a die paddle.

FIG. 3 illustrates, in relation to FIGS. 1 and 2a-2c, an un-singulated leadframe 120 adapted for mounting a semiconductor die for structural support and interconnection. Leadframe 120 includes die pad or die paddle 122, lead fingers 124, and frame 126. Lead fingers 124 are initially connected to frame 126 and die paddle 122. Alternatively, die paddle 122 can be connected to frame 126 through tie bars running from the corners of the die paddle to the corners of the frame, similar to FIG. 4. Frame 126 is separated from die paddle 122 and lead fingers 124 after mounting the semiconductor die to the die paddle and encapsulating the die and leadframe.

Figure 4:
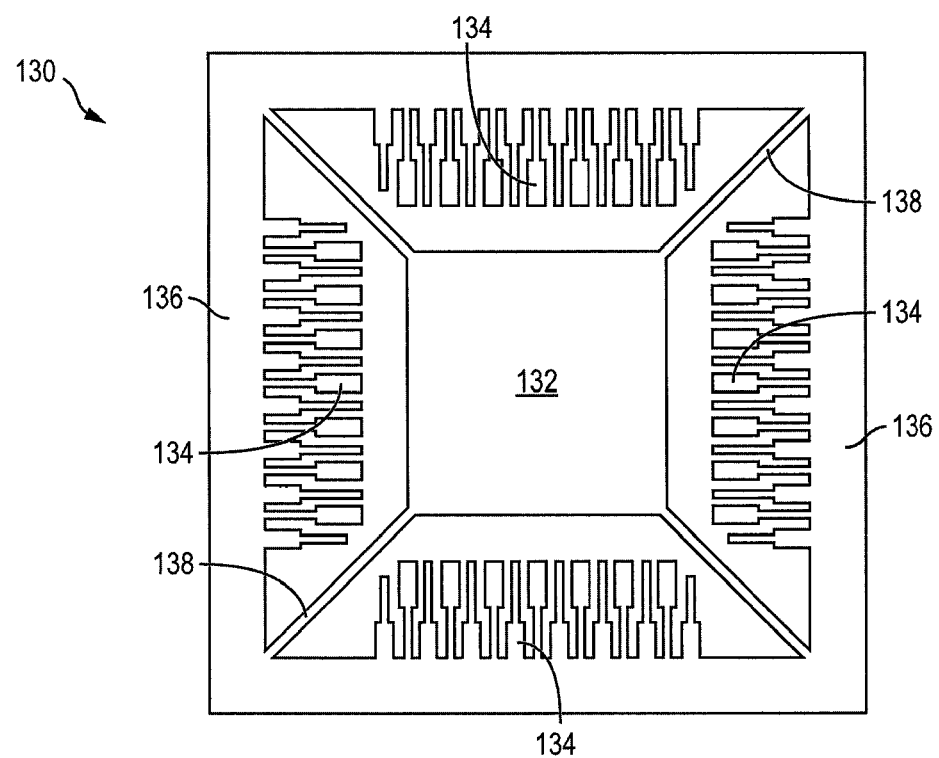
FIG. 4 illustrates another leadframe with lead fingers disposed around a die paddle.

In another embodiment, FIG. 4 shows un-singulated leadframe 130 including a die pad or die paddle 132, staggered lead fingers 134, and frame 136 with tie bars 138. Die paddle 132 can be level with lead fingers 134 or elevated with respect to the lead fingers. Lead fingers 134 are initially connected to frame 136, and die paddle 132 is initially connected through tie bars 138 to frame 136. Frame 136 is separated from die paddle 132 and lead fingers 134 after mounting the semiconductor die to the die paddle and encapsulating the die and leadframe. Leadframes 120 and 130 can be gold, silver, nickel, platinum, copper, copper alloys (including one or more elements of nickel, iron, zinc, tin, chromium, silver, and phosphorous), or other suitable materials.

Figure 5A:
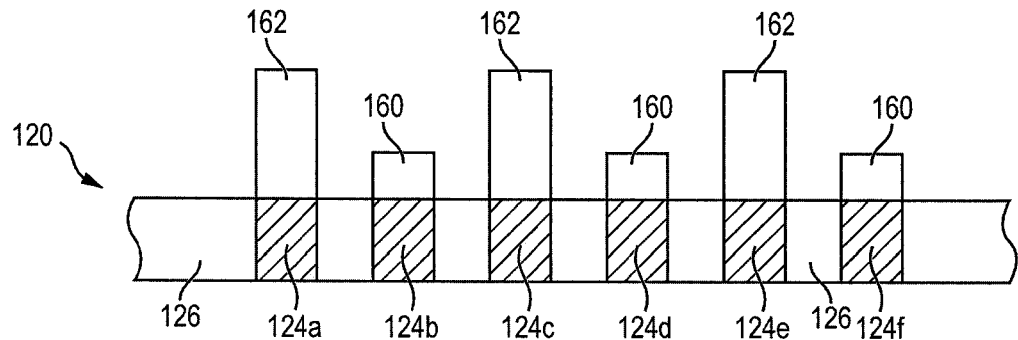
FIGS. 5a-5i illustrate a process of forming a vertically offset BOT interconnect structure over the lead fingers of a leadframe.

FIG. 5a shows a cross-sectional view of lead fingers 124 and frame 126 of leadframe 120 taken along line 5a-5a of FIG. 3. A plurality of conductive layers or leads 160 formed over an alternating set of lead fingers 124b, 124d, and 124f of leadframe 120. In addition, a plurality of conductive layers or leads 162 is formed over an alternating set of lead fingers 124a, 124c, and 124e. The conductive layers 160 and 162 can be stamped, coined, or etched onto lead fingers 124. Alternatively, conductive layers 160 and 162 can be formed using electrolytic plating, electroless plating process, or other suitable metal deposition process. The conductive layers 160 and 162 can be one or more layers of Al, Cu, Sn, Ni, Au, Ag, or other suitable electrically conductive material. The alternating pattern of conductive layers 160 and 162 can also be formed on lead fingers 134 of leadframe 130, in a similar manner as described for leadframe 120.

Figure 5B:
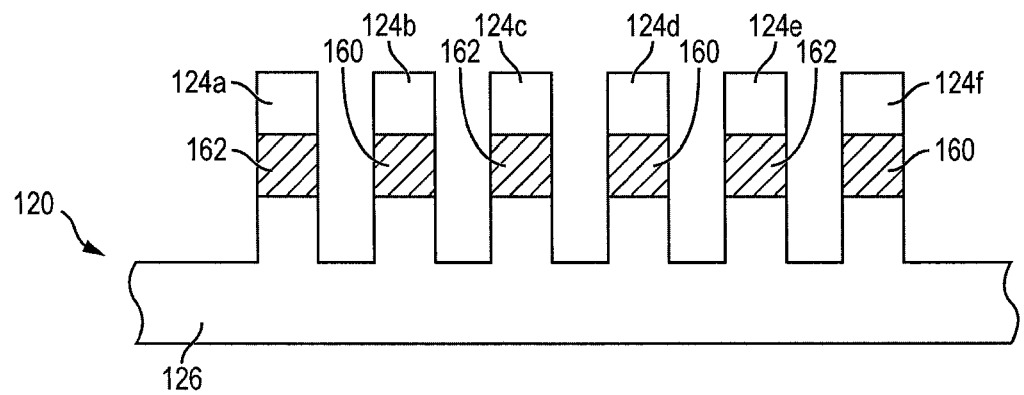

The conductive layers 160 and 162 are vertically offset, i.e., conductive layer 160 has a different height than conductive layer 162. In particular, conductive layer 162 has a greater height than conductive layer 160. Accordingly, in the alternating pattern, a higher conductive layer 162 is placed adjacent to a shorter conductive layer 160, which is adjacent to higher conductive layer 162, which is adjacent to a short conductive layer 160, and so on. In one embodiment, conductive layers 160 have a height of 5 micrometers (μm) above lead finger 124, and conductive layers 162 have a height of 25 μm above lead finger 124, giving a differential height of 20 μm between conductive layers 160 and 162. FIG. 5b is a top view of lead fingers 124 and frame 126 of leadframe 120 with the alternating pattern of vertically offset conductive layers 160 and 162 linearly formed in a side-by-side arrangement over lead fingers 124a-124f.

Figure 5C:
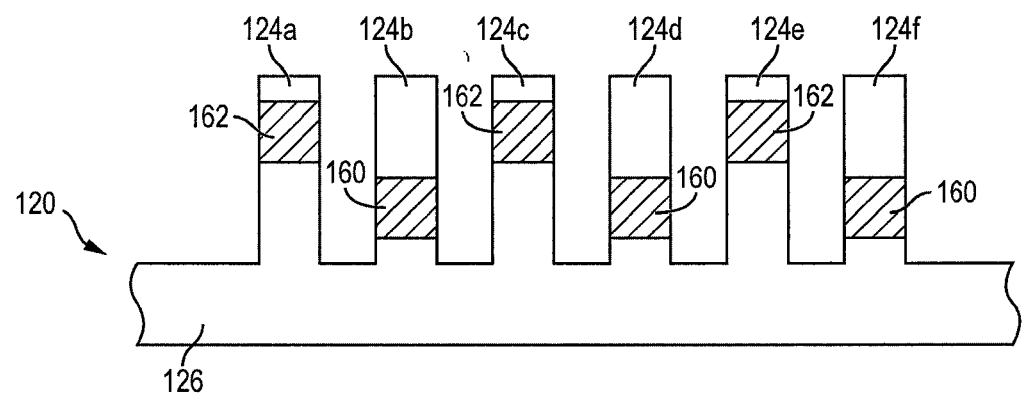

In another embodiment, the alternating pattern of vertically offset conductive layers 160 and 162 can be formed in a staggered arrangement over lead fingers 124a-124f, as shown in FIG. 5c. In each case, the vertically offset conductive layers 160 and 162 are placed close together to minimize pitch and increase I/O count while maintaining sufficient spacing to avoid electrical shorting after bump formation. In one embodiment, the pitch between conductive layers 160 and 162 is less than 60 μm.

Figure 5D:
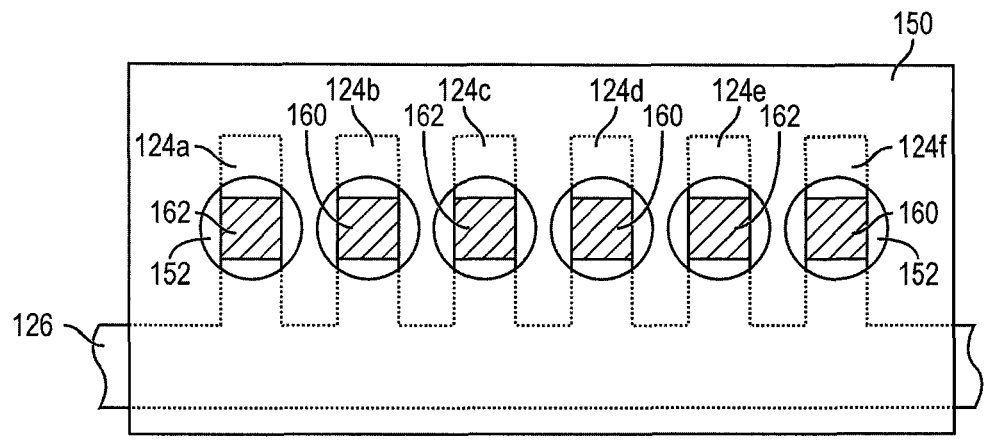
Figure 5E:
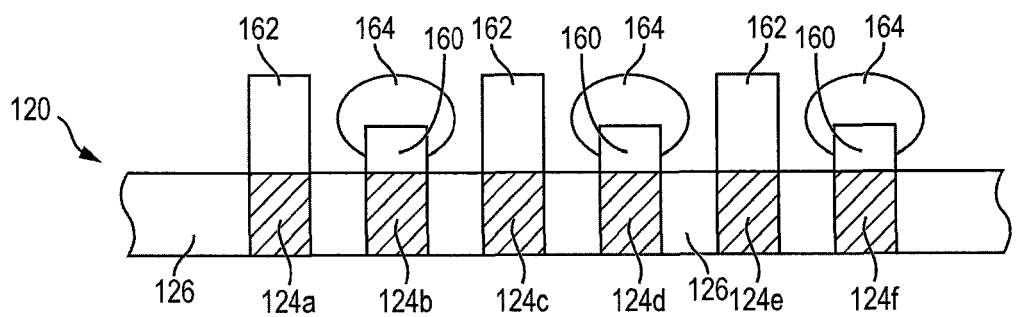

In FIG. 5d, a masking layer 150 can be formed over leadframe 120 with openings 152 in the masking layer over conductive layers 160 and 162 from FIG. 5b. In the cross-sectional view of FIG. 5e, a plurality of bumps 164 with bond wires 165 is formed through opening 152 in masking layer 150 over conductive layer 160 as a BOT interconnect structure. In the cross-sectional view of FIG. 5f, a plurality of bumps 166 with bond wires 167 is formed through openings 152 in masking layer 150 over conductive layer 162 as a BOT interconnect structure. In one embodiment, with 20 μm (0.8 mil) bond wires 165 and 167, the height of bond wire bumps 164 and 166 is about 10 μm. Bumps 164 and 166 are formed at or near the tips of the vertically offset conductive layers 160 and 162 to prevent shorting between adjacent bond wires and conductive layers. Other BOT interconnect structures can be formed over conductive layers 160 and 162, such as stud bumps, conductive posts, or conductive pillars.

Figure 5F:
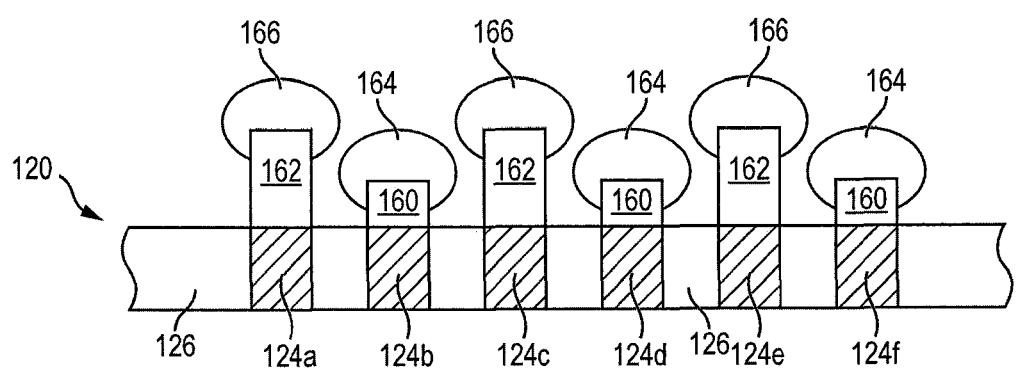
Figure 5G:
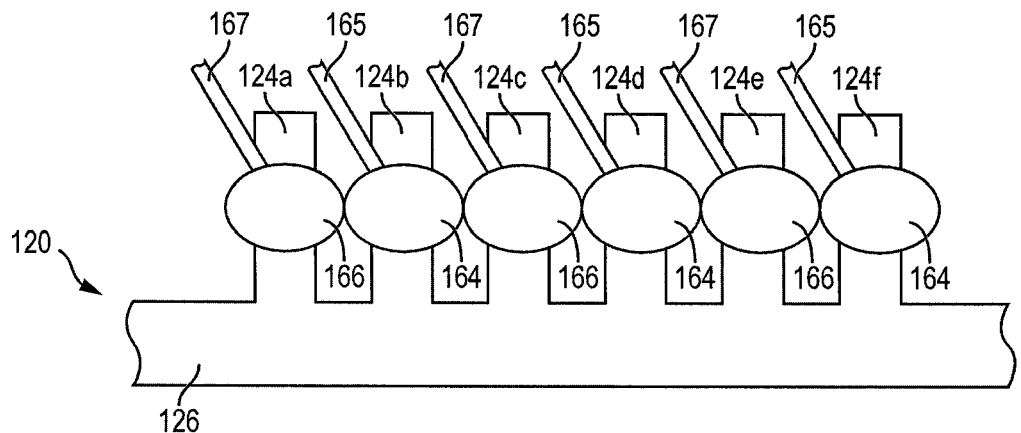

FIG. 5g is a top view of bumps 164 with bond wires 165 and bumps 166 with bond wires 167 linearly formed in a side-by-side arrangement over vertically offset conductive layers 160 and 162. The vertical offset between conductive layers 160 and 162 formed over lead fingers 124 of leadframe 120 allow bond wire bumps 164 and 166 to be placed close together for a small pitch. The interconnect density of the bond wires increases with the smaller pitch of the bond wire bumps, without increasing the length of the lead fingers. In addition, the smaller pitch provides for smaller bond wires which reduces manufacturing cost. The outer dimensions of bond wire bumps 164 and 166 can overlap in the plane view of FIG. 5g, but do not electrically short due to the physical separation between the bumps provided by the vertical offset of conductive layers 160 and 162, as seen in FIG. 5f.

Figure 5H:
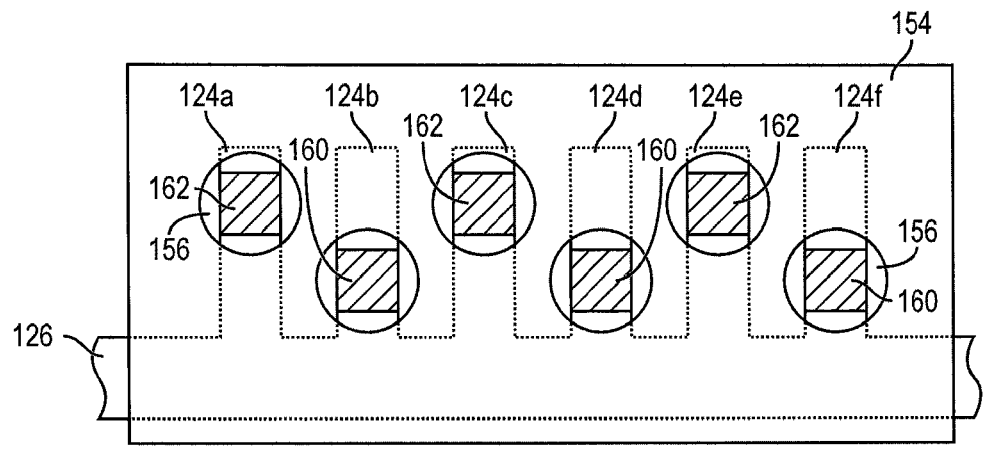
Figure 5I:
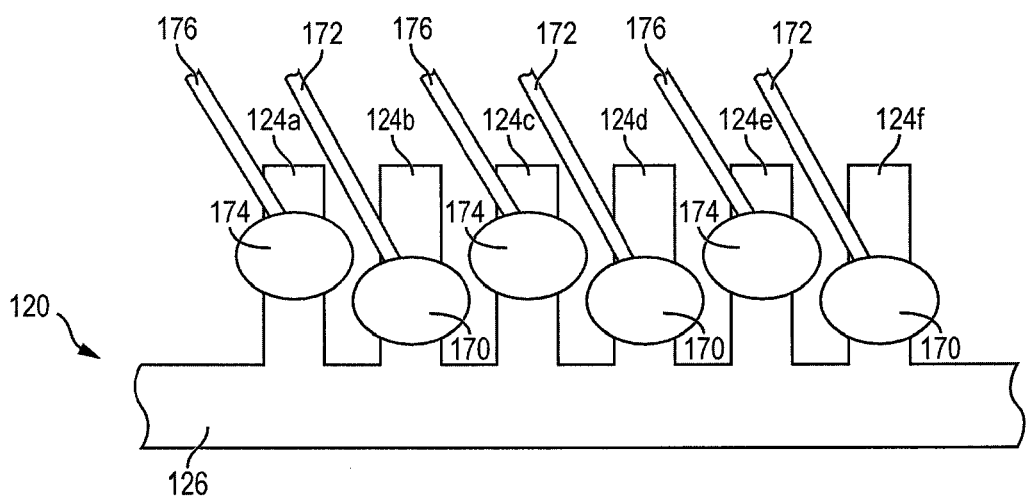

In FIG. 5h, a masking layer 154 can be formed over the configuration of leadframe 120 from FIG. 5c with openings 156 in the masking layer over the staggered conductive layers 160 and 162. A plurality of bumps 170 with bond wires 172 is formed through opening 156 in masking layer 154 over conductive layer 160 as a BOT interconnect structure. A plurality of bumps 174 with bond wires 176 is formed through openings 156 in masking layer 154 over conductive layer 162 as a BOT interconnect structure. FIG. 5i shows bumps 170 with bond wires 172 and bumps 174 with bond wires 176 staggered over the vertically offset conductive layers 160 and 162 from the embodiment of FIG. 5c. The bumps with bond wires can also be formed over the staggered lead fingers 134 of leadframe 130, similar to the description of leadframe 120.

Figure 6A:
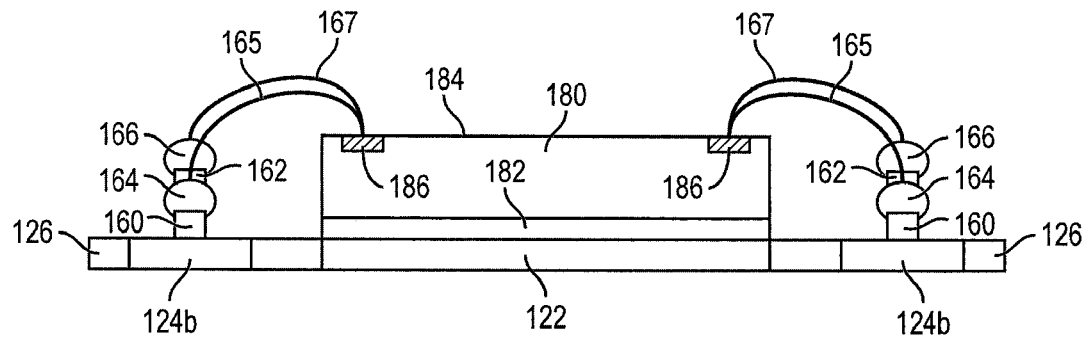
FIGS. 6a-6c illustrate a semiconductor die mounted to the die paddle and electrically connected to the vertically offset BOT interconnect structure.

In FIG. 6a, a semiconductor die 180 is mounted to die paddle 122 of leadframe 120 with die attach adhesive 182, such as epoxy resin, for structural support and interconnection. Semiconductor die 180 has an active surface 184 containing analog or digital circuits implemented as active devices, passive devices, conductive layers, and dielectric layers electrically interconnected according to the electrical design and function of the die. For example, the circuit may include one or more transistors, diodes, and other circuit elements formed within active surface 184 to implement analog circuits or digital circuits, such as digital signal processor (DSP), ASIC, memory, or other signal processing circuit. The semiconductor substrate may also contain IPDs, such as inductors, capacitors, and resistors, for RF signal processing. A plurality of contact pads 186 is formed on active surface 184 and electrically connected to the circuits on the active surface. Contact pads 186 are electrically connected through bond wires 165 and 167 to bumps 164 and 166 on vertically offset conductive layers 160 and 162. Semiconductor die 180 can be mounted to die paddle 132 of leadframe 130 in a similar manner as described in FIG. 6a.

Figure 6B:
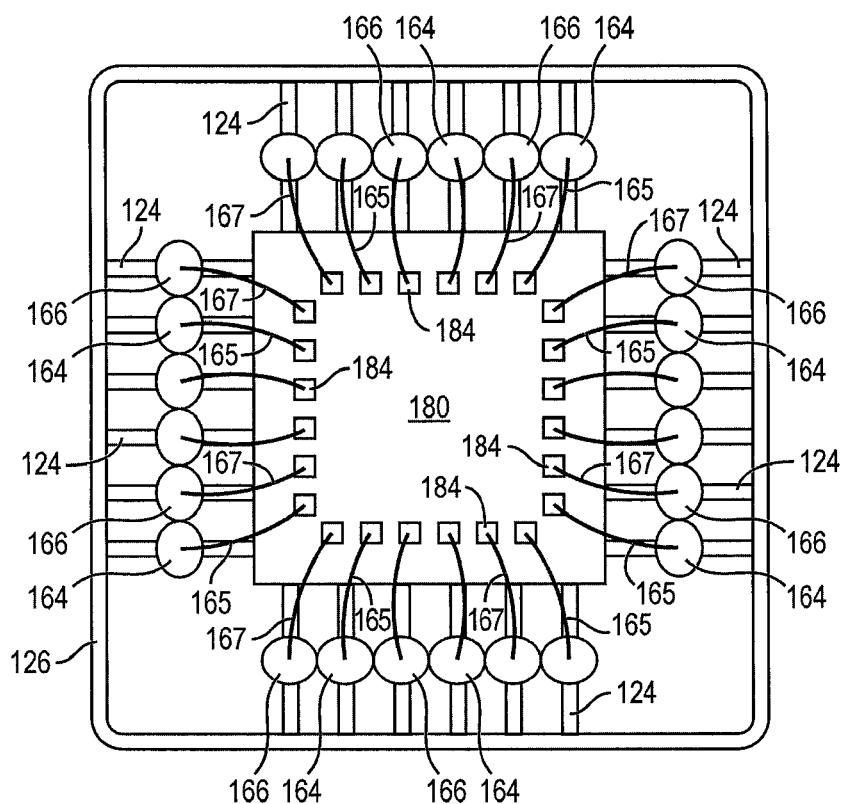

FIG. 6b shows a top view of semiconductor die 180 with contact pads 184 electrically connected to bumps 164 and 166 formed on vertically offset conductive layers 160 and 162 with bond wires 165 and 167. The outer dimensions of bumps 164 and 166 can overlap in the plane view, but do not electrically short due to the physical separation between the bumps provided by the vertical offset of conductive layers 160 and 162.

Figure 6C:
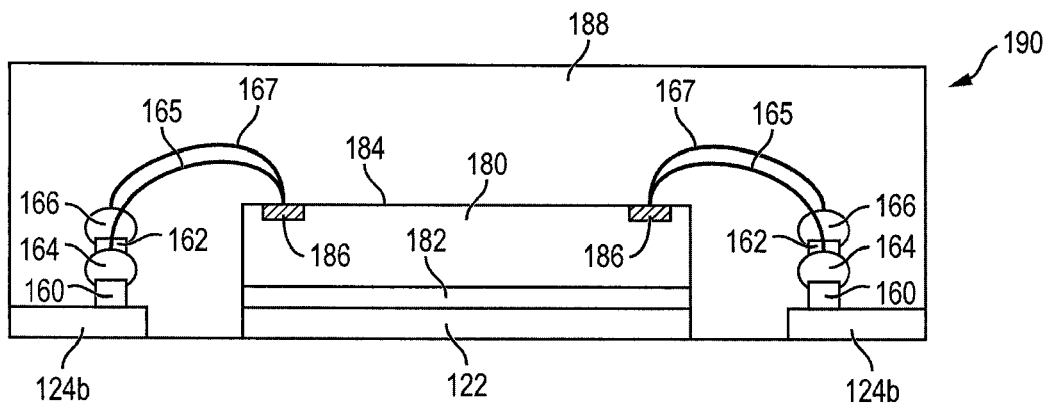

In FIG. 6c, an encapsulant or molding compound 188 is deposited over semiconductor die 180 and leadframe 122 using a paste printing, compressive molding, transfer molding, liquid encapsulant molding, vacuum lamination, spin coating, or other suitable applicator. Encapsulant 188 can be polymer composite material, such as epoxy resin with filler, epoxy acrylate with filler, or polymer with proper filler. Encapsulant 188 is non-conductive and environmentally protects the semiconductor device from external elements and contaminants.

The leadframe is singulated to separate frame 126 from lead fingers 124 and form a semiconductor package 190, such as quad flat no-lead (QFN), quad flat pack (QFP), quad flat no-lead strip edge (QFN-se), and quad flat no-lead multi-row (QFN-mr). Lead fingers 124 extend out the bottom and sides of the semiconductor package 190. The vertical offset between conductive layers 160 and 162 allow bond wire bumps 164 and 166 to be placed close together for a small pitch. The interconnect density of the bond wires increases with the smaller pitch of the bond wire bumps, without increasing the length of the lead fingers. In addition, the smaller pitch provides for smaller bond wires. The vertically offset BOT interconnects formed over a leadframe reduces manufacturing cost, decreases pitch, and increases I/O count.

Figure 7:
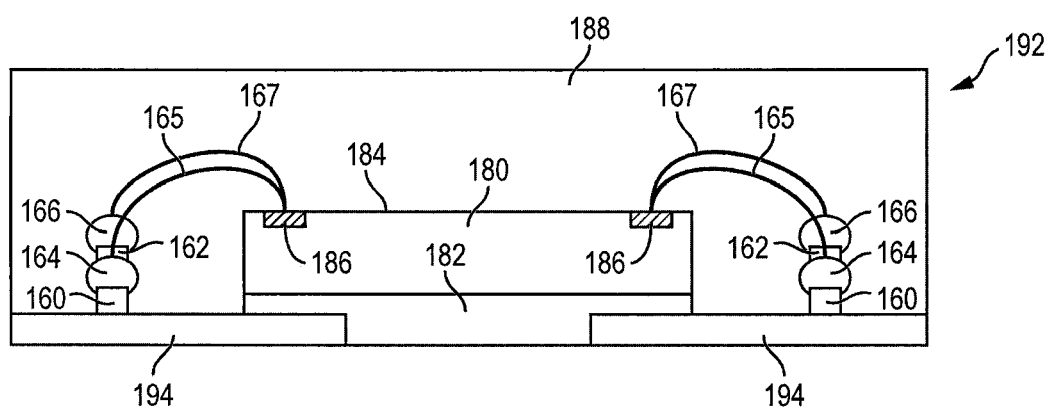
FIG. 7 illustrate a chip-on-lead semiconductor package with the lead fingers extending beneath a footprint of the semiconductor die.

FIG. 7 shows an embodiment of a chip-on-lead semiconductor package 192, similar to FIG. 6c, with vertically offset conductive layers 164 and 166 formed over lead fingers 194. The lead fingers 194 extend beneath a footprint of semiconductor die 180.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate including a first lead finger and second lead finger adjacent to the first lead finger, the first lead finger and second lead finger comprising a surface disposed at a same level around a die area;
   a semiconductor die disposed over the substrate;
   a first conductive layer formed over the surface of the first lead finger;
   a second conductive layer formed over the surface of the second lead finger, wherein a thickness of the second conductive layer is greater than a thickness of the first conductive layer;
   a first bump formed over the first conductive layer at a first distance from the semiconductor die with a width of the first bump greater than a width of the first conductive layer; and
   a second bump formed over the second conductive layer at a second distance from the semiconductor die with the second distance substantially equal to the first distance, the first bump overlaps the second bump and the first bump and the second bump are physically separated due to the thickness of the second conductive layer being greater than the thickness of the first conductive layer.

2. The semiconductor device of claim 1, wherein a difference between the thickness of the first conductive layer and the thickness of the second conductive layer is about 20 micrometers.

3. The semiconductor device of claim 1, further including a plurality of bond wires disposed between the first and second bumps and semiconductor die.

4. The semiconductor device of claim 1, wherein the first lead finger and second lead finger extend under a footprint of the semiconductor die.

5. A semiconductor device, comprising:
   a substrate including a first lead finger and second lead finger, wherein a height of the second lead finger is greater than a height of the first lead finger;
   a first interconnect structure formed over the first lead finger with a width of the first interconnect structure greater than a width of the first lead finger; and
   a second interconnect structure formed over the second lead finger with the second interconnect structure and the first interconnect structure aligned with respect to an edge of the semiconductor device and the first interconnect structure overlapping the second interconnect structure.

6. The semiconductor device of claim 5, wherein the first interconnect structure includes a bump, stud bump, conductive pillar, or conductive post.

7. The semiconductor device of claim 5, wherein a difference between the height of the first lead finger and the height of the second lead finger is about 20 micrometers.

8. The semiconductor device of claim 5, wherein the first interconnect structure and second interconnect structure are staggered over the substrate.

9. The semiconductor device of claim 5, further including a semiconductor die disposed over the substrate.

10. The semiconductor device of claim 9, further including a plurality of bond wires disposed between the first and second interconnect structures and semiconductor die.

11. The semiconductor device of claim 9, wherein a portion of the first lead finger and a portion of the second lead finger extend under a footprint of the semiconductor die.

12. A semiconductor device, comprising:
   a substrate including a first lead finger and second lead finger vertically offset from the first lead finger;
   a first interconnect structure formed over the first lead finger; and
   a second interconnect structure formed over the second lead finger with the second interconnect structure overlapping the first interconnect structure.

13. The semiconductor device of claim 12, wherein the first interconnect structure includes a bump, stud bump, conductive pillar, or conductive post.

14. The semiconductor device of claim 12, wherein the vertical offset between the first lead finger and second lead finger is about 20 micrometers.

15. The semiconductor device of claim 12, wherein the first interconnect structure and second interconnect structure are staggered over the substrate.

16. The semiconductor device of claim 12, further including a semiconductor die disposed over the substrate.

17. The semiconductor device of claim 16, further including a plurality of bond wires disposed between the first and second interconnect structures and semiconductor die.

18. A semiconductor device, comprising:
   a substrate including a first lead finger and second lead finger of equal thicknesses;
   a first conductive layer formed over the first lead finger;
   a second conductive layer formed over the second lead finger, wherein a thickness of the second conductive layer is greater than a thickness of the first conductive layer; and
   a first bump on trace (BOT) interconnect structure formed over the first lead finger and a second BOT interconnect structure formed over the second lead finger the first BOT interconnect structure overlaps the second BOT interconnect structure and the BOT interconnect structures are physically separated due to the thickness of the second conductive layer being greater than the thickness of the first conductive layer.

19. The semiconductor device of claim 18, wherein the first BOT interconnect structure and second BOT interconnect structure overlap in plan view.

20. The semiconductor device of claim 18, wherein the first BOT interconnect structure includes a bump, stud bump, conductive pillar, or conductive post.

21. The semiconductor device of claim 18, wherein the first BOT interconnect structure and second BOT interconnect structure are staggered over the substrate.

22. The semiconductor device of claim 18, further including a semiconductor die disposed over the substrate.

23. The semiconductor device of claim 22, further including a plurality of bond wires disposed between the first BOT interconnect structure and semiconductor die.

* * * * *